(12) United States Patent
Barnes

(10) Patent No.: US 6,522,164 B2
(45) Date of Patent: Feb. 18, 2003

(54) SWITCHING CIRCUIT

(75) Inventor: William Bryan Barnes, Bristol (GB)

(73) Assignee: STMicroelectronics Limited, Bristol (GB)

( * ) Notice: Subject to any disclaimer, the term of this patent is extended or adjusted under 35 U.S.C. 154(b) by 0 days.

(21) Appl. No.: 09/949,703

(22) Filed: Sep. 10, 2001

(65) Prior Publication Data
US 2002/0005733 A1 Jan. 17, 2002

Related U.S. Application Data

(63) Continuation of application No. 09/703,263, filed on Oct. 31, 2000.

(30) Foreign Application Priority Data

Nov. 3, 1999 (GB) ............................................. 9926072

(51) Int. Cl.⁷ ............................................... H03K 17/16
(52) U.S. Cl. .......................... 326/27; 326/83; 327/215
(58) Field of Search ............................. 326/83, 85, 68, 326/112, 119, 81, 27; 327/215, 55, 228

(56) References Cited

U.S. PATENT DOCUMENTS

| 4,897,567 A | 1/1990 | Bacrania ...................... 307/475 |
| 5,399,928 A | * 3/1995 | Lin et al. ..................... 327/434 |
| 5,444,396 A | 8/1995 | Soneda ......................... 326/81 |
| 5,539,334 A | 7/1996 | Clapp, III et al. ............ 326/68 |

FOREIGN PATENT DOCUMENTS

| EP | 0 661 811 | 7/1995 | .......... H03K/3/356 |
| JP | 08046508 A | * 2/1996 | |

* cited by examiner

Primary Examiner—Michael Tokar
Assistant Examiner—Daniel D. Chang
(74) Attorney, Agent, or Firm—Wolf, Greenfield & Sacks, P.C.; James H. Morris; Robert A. Skrivanek, Jr.

(57) ABSTRACT

A switching circuit is discussed that has an improved switching time in comparison with switching circuits of a known type. The circuit comprises three switches connected in series, the first switch being connected to an upper power supply and the third switch being connected to a lower power supply. The output of the circuit is connected to a circuit node located at the connection between the second and third switch. The input to the switching circuit is also connected to the third switch and additionally connected to a control circuit which provides a further output to control the first switch. The second switch is responsive to the voltage at the circuit node such that the second switch only conducts when the voltage at the output node falls below the upper supply voltage. This has the effect that the first switch is effectively isolated from the third switch during switching and allows a time delay during which the first switch is switched off under control of the control circuit and the second switch switches on. The provision of the voltage dependent second switch eliminates any 'current battles' occurring between the first and third switch during switching.

12 Claims, 2 Drawing Sheets

US 6,522,164 B2

SWITCHING CIRCUIT

CROSS REFERENCE TO RELATED APPLICATIONS

This application is a continuation of prior application Ser. No. 09/703,263, filed on Oct. 31, 2000, entitled SWITCHING CIRCUIT, now abandoned.

FIELD OF THE INVENTION

The present invention relates to a switching circuit and more particularly but not exclusively to a switching circuit for an output node.

BACKGROUND OF THE INVENTION

In integrated circuits there often exists a need to switch a circuit node from a first state, or voltage level, to a second state, or voltage level. There are known circuits which have been provided for providing such a switching function. However it is often found that the speed of switching of these known circuits is unsatisfactorily show and also unacceptable switching currents are present.

It is an aim of embodiments of the present invention to provide a switching circuit which mitigates against the disadvantages of known switching circuits.

SUMMARY OF THE INVENTION

According to the present invention there is provided a switching circuit for an output node comprising: pull-up circuitry connected to said output node and an upper supply voltage node, said pull-up circuitry having control circuitry for causing said pull-up circuitry to supply a pull-up current to said output node; a switch connected between said output node and said pull-up circuitry, said switch being responsive to a voltage at said output node whereby said switch is rendered non-conductive when said output node is at a voltage substantially equal to said upper supply voltage; pull-down circuitry connected to said output node and a lower supply voltage node for supplying a pull-up down current to said output node, whereby when the voltage at said output node falls said switch becomes conductive, wherein said control circuitry substantially terminates operation of said pull-up circuitry while said switch is non-conductive.

According to the present invention there is also provided a method of switching an output node comprises: controlling a pull-up circuit to supply a pull-up current to said output node; sensing a voltage at said output node and in response to said voltage being substantially equal to an upper supply voltage, rendering non-conductive a switch disposed between said pull-up circuit and said output node; while said switch is non-conductive, substantially terminating operation of said pull-up circuit, and initiating operating of a pull-down circuit to supply a pull-down current to said output node whereby said voltage falls and said switch becomes conductive; and thereafter completing pull-down of said output node.

According to the present invention there is further provided a method of switching an output node comprising: controlling a pull-down circuit to supply a pull-down current to said output node; sensing a voltage at said output node and in response to said voltage being substantially equal to a lower supply voltage, rendering non-conductive a switch disposed between said pull-down circuit and said output node; while said switch is non-conductive, substantially terminating operation of said pull-down circuit, and initiating operation of a pull-up circuit to supply a pull-up current to said output node whereby said voltage rises and said switch becomes conductive; and thereafter completing pull-up of said output node.

To provide a better understanding of the present invention a preferred embodiment will now be described in further detail by way of example with reference to the following Figures, in which;

BRIEF DESCRIPTION OF THE DRAWINGS

Unless stated otherwise, like reference numerals indicate like parts.

DESCRIPTION OF A PREFERRED EMBODIMENT OF THE INVENTION

Figure 1:
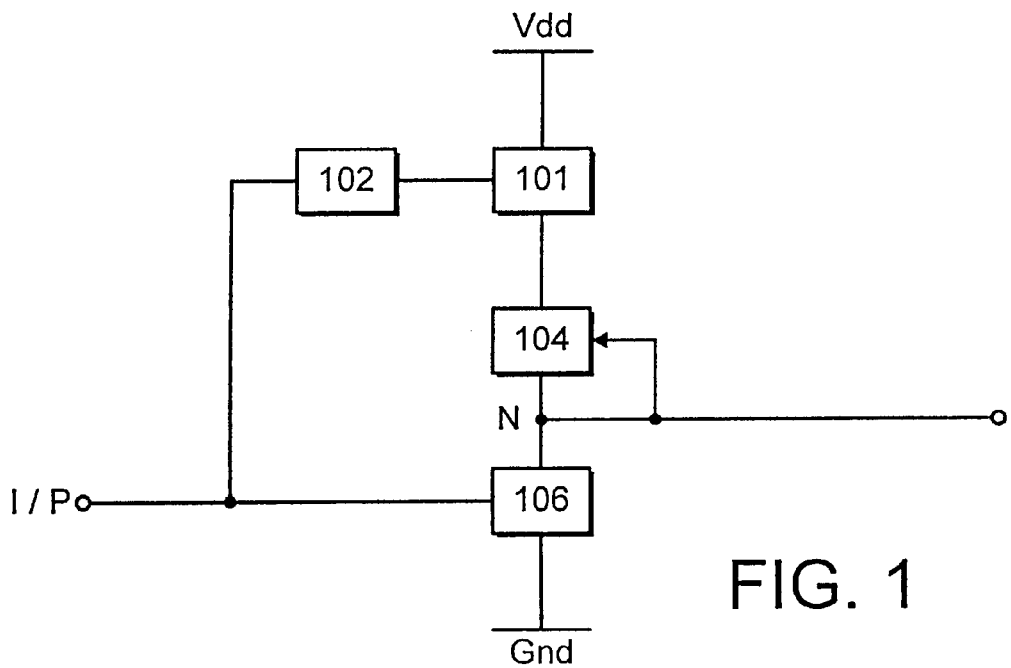
FIG. 1 shows a schematic diagram of a first embodiment of the present invention.

FIG. 1 shows a schematic diagram of an embodiment of the present invention. A pull-up circuit 101 is connected to an upper supply Vdd and to an output node N. A control circuit 102 is also connected to the pull-up circuit 101 and controls the pull-up circuit to supply a pull-up current to the output node N. The control circuit 102 has an input connected to an input node i/p. A switch 104 is connected between the pull-up circuit 101 and the output node N. The switch 104 is responsive to the voltage at the output node N and is rendered non-conductive when the voltage at the output node N is at a high voltage, preferably at substantially the same voltage as the upper supply voltage Vdd. A pull-down circuit 105 is connected between the output node N and a lower supply voltage Gnd. The pull-down circuit also has an input connected to the output node i/p and in response to an appropriate signal being applied to the input node i/p, provides a pull-down current to the output node N. The operation of the present invention will be described with reference to the switching circuit shown in FIG. 2.

Figure 2:
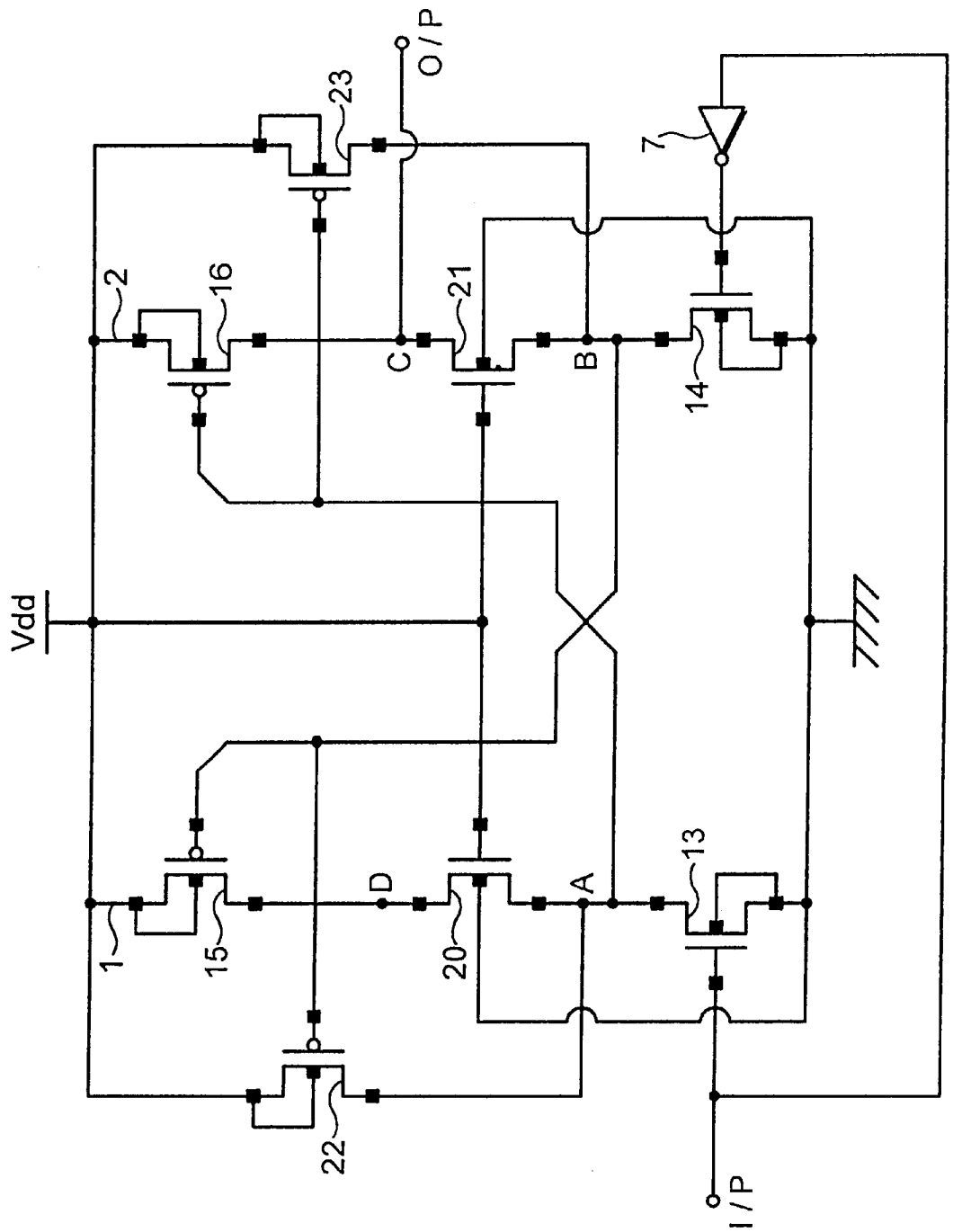
FIG. 2 shows a circuit diagram of a switching circuit according to a second embodiment of the present invention.

FIG. 2 shows a circuit diagram of a switching circuit according to a second embodiment of the present invention. The circuit of FIG. 2 comprises two circuit branches, a left hand circuit branch 1 and a right hand circuit branch 2, with each circuit branch comprising a first NMOS transistor 13, 14 and a first PMOS transistor 15,16. Each circuit branch of the circuit of FIG. 2 also comprises a second NMOS transistor 20,21 connected between the first NMOS transistor 13,14 and the PMOS transistor 15,16 of each circuit branch 1,2. The sources of the second NMOS transistors 20,21 are connected to the drains of the first NMOS transistors 13,14 in respective current branches while the gates of the second NMOS transistors 20,21 are connected to the upper supply voltage Vdd.

Each circuit branch further comprises a second PMOS transistor 22,23. The source of each second PMOS transistor 22,23 is connected to the upper supply voltage Vdd and their drains are connected to the source connection of the respective second NMOS transistors 20,21. These connections will be referred to as hereinafter as node A and node B. The gates of the second PMOS transistors 22,23 are connected to the gates of respective first PMOS transistors 15,16. The output of the circuit o/p is connected to the circuit node which is located at the drain to drain connection of the first PMOS transistor 16 of the right hand circuit branch and the corresponding second NMOS transistor 21. This circuit node will be referred to hereinafter as node C.

The first and second NMOS transistors (13,14,20,21) are arranged to be weak transistors, as are the second PMOS transistors 22,23. The first PMOS transistors 15,16 are, on the other hand, strong transistors in comparison to the other transistors. It is to be understood that references to a strong transistor in this application refer to a transistor having a relatively high value of Idd with respect to other transistors in the circuit which have a lower value of Idd and are referred to as weak transistors.

The operation of the circuit shown in FIG. 2 will now be described. Assume that the input signal at the input i/P is at a logic level high. The first NMOS transistors 13,14 will be turned on and off respectively. Hence node A will be pulled to ground through transistor 13 of the left hand circuit branch. The second NMOS transistor 20 of the left hand circuit branch will be switched on and thus the circuit node at the drain to drain connection of that second NMOS transistor 20 and the corresponding first PMOS transistor 15 will also be pulled down to a voltage level approximately equal to ground. This circuit node will be referred to hereinafter as node D. As node A is at substantially ground voltage, so is the gate voltage on the first and second PMOS transistors 16, 23 of the right hand circuit branch and thus these two transistors are conductive. Hence node C and thus the output o/p are pulled up to the upper voltage supply level Vdd by the first PMOS transistor of the right hand circuit branch 16 and node B is similarly pulled up to Vdd by the second PMOS transistor 23 of the right hand circuit branch. Consequently, the first and second PMOS transistors 15,22 of the left hand circuit branch are off. As node B is at substantially the same voltage level as the voltage level at the gate of the second NMOS transistor 21 of the right hand circuit branch, that is Vdd, the gate/source voltage, Vgs does not exceed the threshold voltage for this transistor and it is therefore non-conducting.

Assuming now that the input voltage at the input i/P switches from a logic level high to a logic level low. The first NMOS transistor 13 of the left hand circuit branch switches off while the corresponding NMOS transistor 14 of the right hand circuit branch is switched on. Node B now starts to fall as it is pulled down by the action of the first NMOS transistor 14 of the right hand circuit branch. As previously explained the second NMOS transistor 21 of the right hand circuit branch is initially off and thus for the first NMOS transistor 14 of the right hand circuit branch to pull node B towards ground, it must only act against the still conducting second PMOS transistor 23 of the right hand circuit branch, rather than against the first PMOS transistor 16 of right hand circuit branch. The second PMOS transistor of this circuit branch is arranged to be a weak transistor and together with the fact that the second NMOS transistor 21 of the right circuit branch is effectively open circuit at this point, the first NMOS transistor 14 of the right circuit branch is able to pull down node B to a voltage level Vdd minus Vth (Vth being the threshold voltage of the second NMOS transistor 21) in a relatively short time period. The drop in voltage of node B to Vdd minus Vth is mirrored at the gate of the first PMOS transistor 15 of the left hand circuit branch and is of a sufficient magnitude to turn on this PMOS transistor 15 by a substantial amount, as well as the second PMOS transistor 22 of the left hand circuit branch. Node D now starts to rise in voltage due to the action of the first PMOS transistor 15 of the left hand circuit branch while node A also starts to rise by virtue of the action of the second PMOS transistor 22 of the left hand circuit branch. At this point the second NMOS transistor 20 of the left hand circuit branch is conductive and so node A is also pulled up together with node D by the first PMOS transistor 15 of the left hand circuit branch. Subsequently, this rise in voltage of node A is mirrored on the gates of the first and second PMOS transistors 16,23 of the right hand circuit branch which are hence rendered substantially non-conductive. The first PMOS transistor 16 is arranged to be a "strong" transistor and is thus not subject to a large rise time.

Concurrently when node B reaches a voltage level Vdd minus Vth, the voltage Vgs of the second NMOS transistor 21 of the right hand circuit branch is sufficient to turn this transistor on. However, the first PMOS transistor 16 of the right hand circuit branch has now been turned substantially off and so node B and node C can be pulled down by the first NMOS transistor 14 of the right hand circuit branch without competition from the corresponding PMOS transistor 16. As node B is pulled fully to ground the first and second PMOS transistors 15,22 of the left hand circuit branch are turned fully on. This allows the second PMOS transistor 22 of left hand circuit branch to fully pull up node A to the upper supply voltage Vdd and thus fully turn off the first and second PMOS transistors 16,23 of the right hand circuit branch.

An advantage of the switching circuit as shown in FIG. 2 is that as the first NMOS transistors 13, 14 of each circuit branch do not have to overpower the first PMOS transistors 15,16 of respective circuit branches, the first PMOS transistors 15,16 may be arranged to be "strong" transistors, that is relatively large, with the result that their respective rise times, and thus the overall switching time of the circuit, is greatly reduced in comparison with the known switching circuits.

A further advantage of embodiments of the present invention over known switching circuits will now be described. In CMOS circuits the performance of the circuit is often reduced due to an effect known as the "body effect". Further reference to FIG. 2 shows that the substrates of the second NMOS transistors 20,21 are connected to the ground voltage, whereas the sources of those transistors are connectable to ground only via the main current path of the respective first NMOS transistors 13, 14. The result is that the substrate connection acts as a back gate to the second NMOS transistors, which back gate is negative relative the source. The effect, known as "body effect" is to require application of a higher front gate potential to turn the relevant transistor on, in other words to raise the transistor threshold voltage Vgs. Hence for a constant gate potential, here equal to Vdd, the source potential is lower.

The consequence of this is that the PMOS transistors will be easier to turn on, as their gates are directly cross-coupled to the corresponding sources of the relevent second NMOS transistor 20, 21. This compensates for increased Idd__ PMOS. Hence the "body effect" is used to the advantage of embodiments of the present invention.

In an alternative embodiment of the present invention the circuit as shown in FIG. 2 may be provided with the omission of the second PMOS transistors 22,23 of each circuit branch. Consider now such a circuit during the transition of the input from a low logic level to a high logic level, as previously described. The operation of the circuit would be initially the same as described hereinbefore up to the point that node A rises to a voltage level of Vdd minus Vth (Vth also being the threshold voltage of the second NMOS transistor 20 of the left hand circuit branch) then the second NMOS transistor 21 of the left hand circuit branch will turn off as the voltage between the gate and source, Vgs will no longer be sufficient to bias the transistor. At this point node A is isolated between the first and second NMOS transistors 13,20 of the left hand circuit branch, which are both in a non-conductive state and thus node A cannot be pulled completely to the upper supply voltage Vdd. Hence as the voltage at node A is mirrored at the gate of the first PMOS transistor 16 of the right hand circuit branch, this transistor will not be fully turned off and thus there will be a small static leakage current through this PMOS transistor.

Hence, although this alternative embodiment of the present invention achieves some of the stated aims of embodiments of the present invention by providing a switching circuit with a reduced switching time, the preferred embodiment shown in FIG. 2 which include a second PMOS transistor 22,23 in each circuit branch is even more advantageous as any static leakage currents through the first PMOS transistors 15,16 are avoided.

It will be appreciated that this circuit would perform in an analogous manner if the conductivity types of the respective transistors were reversed, if all the NMOS transistors were replaced with PMOS transistors and all of the PMOS transistors were replaced with NMOS transistors, together with the polarity of the supply voltages.

It will also be appreciated that the output of the circuit shown in FIG. 2 may alternatively be connected to node D, in which case the output would be the complement of the input value. Alternatively, the output from the circuit shown in FIG. 2 may be connected to either node A or node B which would reduce the time taken for the output o/p to fall from the upper supply voltage Vdd to substantially ground i.e., when the o/p changes from a logical high to a logical low. Conversely the time takes for the output o/p to rise to the upper supply voltage Vdd would increase.

Where both true and complementary outputs from the circuit of FIG. 2 are required then this is easily achieved by connecting outputs to either nodes A and B, or nodes C and D, without the need for any additional circuitry. This feature of the circuit of FIG. 2 has the property that when the output changes from one voltage level to the other, one of the complementary outputs falls to the lower voltage level before the other output rises.

Figure 3:
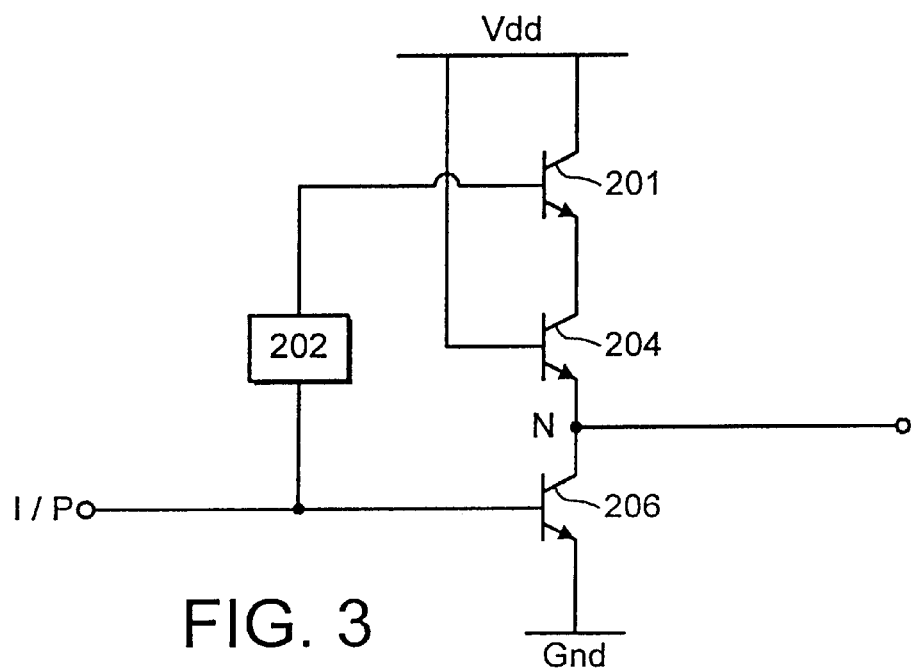
FIG. 3 shows a circuit diagram of a further embodiment of the present invention.

A further embodiment of the present invention is shown in FIG. 3. A pull-up bipolar transistor 201 is connected with its collector connected to an upper supply voltage Vdd and it base connected via a control circuit 202 to an input node i/p. A further transistor 204 is connected in series with the pull-transistor 201 with its base connected to the upper supply voltage Vdd. The further bipolar transistor 204 is thus connected in a common base configuration. The emitter of the common base transistor 204 is connected to an output node N. A pull-down transistor 206 is connected between the output node N and a lower supply voltage Gnd. The base of the pull-down transistor 206 is connected to the input node i/p. The control circuit 202 is arranged to apply a low voltage to the base of the pull-up transistor 201 when a high voltage is received at the input node i/p. Hence the pull-up transistor 201 and the pull-down transistor 206 are driven in an opposite sense. The common base transistor 204 will only be conductive when the voltage at the output node N falls below the voltage supplied to the base of the transistor by an amount at least equal to the threshold voltage of the common base transistor 204, typically for a bipolar transistor 0.6V. The time taken for the output node N to fall by this voltage amount when the pull-down transistor 206 becomes conductive provides sufficient time for the pull-up transistor 201 to turn off before a circuit connection is made between the pull-up transistor 201 and pull-down transistor 206.

What is claimed is:

1. A switching circuit for an output node, comprising:

pull-up circuitry connected to said output node and an upper supply voltage node, said pull-up circuitry having control circuitry for causing said pull-up circuitry to supply a pull-up current to said output node;

a switch having a controllable current path connected between said output node and said pull-up circuitry and having a control terminal connected to said upper supply voltage node, said switch being responsive to a voltage at said output node whereby said switch is rendered non-conductive when said output node is at a voltage substantially equal to said upper supply voltage node;

pull-down circuitry connected to said output node and a lower supply voltage node for supplying a pull-down current to said output node;

whereby when the voltage at said output node falls said switch becomes conductive, wherein said control circuitry substantially terminates operation of said pull-up circuitry while said switch is non-conductive.

2. A circuit as claimed in claim 1, wherein said switch comprises a field effect transistor having a common gate connection.

3. A circuit as claimed in claim 2, wherein the gate of said field effect transistor is connected to said upper supply voltage node.

4. A circuit as claimed in claim 2, wherein the substrate of said field effect transistor is connected to said lower supply voltage node.

5. A circuit as claimed in claim 1, wherein said switch comprises a bipolar transistor having a common base connection.

6. A circuit as claimed in claim 5, wherein the base of said bipolar transistor is connected to said upper supply voltage node.

7. A circuit as claimed in claim 1, wherein said pull-up circuitry comprises a first PMOS field effect transistor.

8. A circuit as claimed in claim 7, wherein said pull-up circuitry further comprises a second PMOS field effect transistor connected between said upper supply voltage node and said output node, said second PMOS transistor having a lower source-to-drain saturation current than said first PMOS transistor.

9. A circuit as claimed in claim 8, wherein substantially no static leakage current is present.

10. A circuit as claimed in claim 1, wherein said pull-down circuitry comprises an NMOS field effect transistor.

11. A method of switching an output node, comprising:

controlling a pull-up circuit to supply a pull-up current to said output node;

sensing a voltage at said output node and in response to said voltage being substantially equal to an upper supply voltage, rendering non-conductive a switch disposed between said pull-up circuit and said output node;

while said switch is non-conductive, substantially terminating operation of said pull-up circuit, and initiating operating of a pull-down circuit to supply a pull-down current to said output node whereby said voltage falls and said switch becomes conductive; and thereafter completing pull-down of said output node.

12. A method of switching an output node comprising:

controlling a pull-down circuit to supply a pull-down current to said output node;

sensing a voltage at said output node and in response to said voltage being substantially equal to a lower supply voltage, rendering non-conductive a switch disposed between said pull-down circuit and said output node;

while said switch is non-conductive, substantially terminating operation of said pull-down circuit, and initiating operation of a pull-up circuit to supply a pull-up current to said output node whereby said voltage rises and said switch becomes conductive; and thereafter completing pull-up of said output node.

* * * * *